United States Patent
Jun et al.

(10) Patent No.: US 6,265,251 B1
(45) Date of Patent: Jul. 24, 2001

(54) METHOD TO FABRICATE A THICK OXIDE MOS TRANSISTOR FOR ELECTROSTATIC DISCHARGE PROTECTION IN AN STI PROCESS

(75) Inventors: Cai Jun; Keng Foo Lo, both of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/566,471

(22) Filed: May 8, 2000

(51) Int. Cl.[7] .......................... H01L 21/338; H01L 23/62
(52) U.S. Cl. .......................... 438/183; 438/151; 438/165; 438/284; 438/586; 257/347; 257/355; 257/546; 257/757
(58) Field of Search .................................. 438/183, 151, 438/200, 275, 165, 284, 586; 257/347, 350, 355, 357, 360, 546, 575

(56) References Cited

U.S. PATENT DOCUMENTS

| | | | |
|---|---|---|---|
| 5,517,049 | * 5/1996 | Huang | 257/357 |
| 5,618,740 | 4/1997 | Huang | 438/224 |
| 5,683,918 | * 11/1997 | Smith et al. | 437/21 |
| 5,872,378 | 2/1999 | Rose et al. | 257/355 |
| 5,929,493 | 7/1999 | Wu | 257/369 |
| 6,049,119 | * 4/2000 | Smith | 257/575 |
| 6,078,083 | * 6/2000 | Amersekera et al. | 257/358 |

* cited by examiner

Primary Examiner—Matthew Smith
Assistant Examiner—Igwe U. Anya
(74) Attorney, Agent, or Firm—George O. Saile; Rosemary L. S. Pike

(57) ABSTRACT

A new method of forming a thick oxide MOS transistor for electrostatic discharge protection in a standard sub-micron STI CMOS process for an integrated circuit device has been achieved. A first well and a second well are implanted. The wells are counter-doped to the substrate type. The first well forms the drain, and the second well forms the source. A thin oxide layer is formed. A polysilicon layer is deposited. The polysilicon layer is patterned to form a dummy floating gate. Ions are implanted into the first well to form a first lightly-doped region and into the second well to form a second lightly-doped region of the same type as the wells. The lightly-doped regions are self-aligned to the dummy floating gate. Sidewall spacers are formed on the floating dummy gates. Ions are implanted into the first well to form a first heavily-doped region and the second well to to form a second heavily-doped region of the same type as the wells. The heavily-doped regions are self-aligned to the sidewall spacers. An interlevel dielectric layer is deposited. A metal layer is deposited overlying the interlevel dielectric layer. The metal layer is patterned to form the gate electrode.

20 Claims, 6 Drawing Sheets

METHOD TO FABRICATE A THICK OXIDE MOS TRANSISTOR FOR ELECTROSTATIC DISCHARGE PROTECTION IN AN STI PROCESS

BACKGROUND OF THE INVENTION

(1) Field of the Invention

The invention relates to a method of fabricating semiconductor structures, and more particularly, to a method of forming thick oxide MOS transistors for electrostatic discharge protection in the manufacture of integrated circuit devices.

(2) Description of the Prior Art

Electrostatic discharge (ESD) robustness for CMOS technology has always been a difficult challenge. In larger feature size CMOS processes, thick oxide devices, such as the field oxide device (FOD) or the metal gate over field oxide device (MGFO), have been used to provide ESD protection for integrated circuit inputs. With the advent of sub-micron feature sizes, new approaches to ESD protection have become necessary.

Referring to FIG. 1, an input pad 10 is shown for a prior art CMOS integrated circuit. The input pad 10 in this application is connected to an inverter-buffer 18. To protect the transistors of the inverter-buffer 18 from ESD events, a field oxide device (FOD) 14 is fabricated on the circuit in the input path. The FOD transistor 14 is designed to perform several functions. First, if the FOD transistor 14 is an n-channel device, there is p-n diode between the substrate and the drain of the FOD. This will effectively clamp negative voltages to one diode drop below the substrate voltage. Second, and more importantly, the FOD device 14 is designed to shunt positive voltage spikes, such as during an ESD event, to the substrate while protecting the inverter-buffer 18.

Two features enable the FOD transistor 14 to protect against ESD events while not being destroyed in the process. First, the FOD transistor 14 is specially designed to have a large voltage threshold ($V_t$). The FOD transistor 14 may be formed with either a polysilicon or metal gate. Unlike typical transistors, which have gate electrodes formed over very thin oxide, the FOD electrode is formed over a section of very thick field oxide. Since $V_t$ is proportional to the thickness of the gate oxide, $V_t$ for the FOD 14 is relatively large (15 V to 30 V) compared to that of the logic transistors of the inverter-buffer 18 (around 0.7 V). The large voltage threshold means that the FOD transistor is an open circuit for all expected input voltages excepting ESD events.

The second feature of the FOD transistor 14 is its performance during the ESD event. Under ESD stress conditions, the FOD behavior changes drastically from normal MOS operation. The conduction mechanism changes to a parasitic lateral bipolar device. Normal MOS channel conduction does not have the capability of carrying amps of current. The onset of bipolar action is determined by the avalanche breakdown of the n+ drain diffusion with the generation of electron-hole pairs. The generated electrons are swept across the drain towards the drain contact, adding to the drain current. The generated holes drift towards the substrate contact thereby giving rise to a substrate current similar to the base current of the bipolar transistor. As substrate current increases, the potential at the source-substrate junction increases to the point of forward-biasing this junction and causing electrons to be emitted into the substrate. When the electron current density from the source begins to contribute to the drain current, the parasitic bipolar transistor may be considered to be turned on. This is called snapback.

Once the lateral bipolar transistor turns on, the operating mechanism of the device is similar to that of an npn bipolar transistor. The drain voltage decreases. A negative resistance region is observed due to the availability of more carriers for multiplication until a minimum voltage is reached. A gate is not necessary for npn snapback to take place. However, in the FOD, the gate voltage can change the silicon surface potential and thereby reduce the source (emitter) barrier to turn on the npn device. The npn device turns on at a lower level to protect the thin gate oxide of the inverter-buffer 18.

Referring now to FIG. 2, a cross section of a prior art FOD transistor is shown. Field oxide regions 24 are formed in the substrate 20. Source junctions 32 and drain junctions 28 are formed in the substrate. The gate electrode 44 is formed by the metal layer 40 overlying field oxide region 24 between the source junction 32 and the drain junctions 28. The gate electrode 44 and the drain 48 are then connected to the input pad while the source 52 is connected to the circuit ground (VSS).

Sub-micron CMOS processes cause two problems for the prior art FOD approach. First, many new processes no longer have the field oxide layer formed by local oxidation of silicon (LOCOS). Shallow trench isolation (STI) has replaced LOCOS for isolation region definition. A controllable channel cannot be created under the STI structure. Even if a sub-micron process is not using STI, the shallowness of the junctions necessary to produce sub-micron transistors is a second problem. If very shallow source or drain junctions are used for the FOD, the threshold voltage is lowered. In addition, the device is easily damaged due to concentration of heating during the secondary breakdown event.

Several prior art approaches disclose methods to improve ESD performance of an integrated circuit device. U.S. Pat. No. 5,618,740 to Huang discloses a process to create CMOS outputs that have enhanced ESD resistance. CMOS output transistors do not receive the anti-punch through pocket implant as do core CMOS devices. The absence of the pocket junctions increases the ESD performance of the output transistors. U.S. Pat. No. 5,872,378 to Rose et al teaches an ESD protection network for non-volatile memory circuits. U.S. Pat. No. 5,929,493 to Wu discloses a process for forming CMOS transistors with self-aligned planarization twin well while using fewer masks. A boron blanket implant is included that will increase the threshold of the field oxide device.

SUMMARY OF THE INVENTION

A principal object of the present invention is to provide an effective and very manufacturable method to form thick oxide MOS transistors for electrostatic discharge protection in the manufacture of integrated circuits.

Another object of the present invention is to provide a thick oxide MOS transistor device for electrostatic discharge protection in the manufacture of integrated circuits.

Another further object of the present invention is to provide a method of fabricating a thick oxide MOS transistor without a field oxidation layer.

Another further object of the present invention is to provide a method of fabricating a thick oxide MOS transistor that has deep well source and drain junctions to improve electrostatic discharge performance.

Another yet further object of the present invention is to provide a method to form a thick oxide MOS transistor without adding processing complexity.

In accordance with the objects of this invention, a new method of forming a thick gate oxide MOS transistor for electrostatic discharge protection in the manufacture of an integrated circuit device has been achieved. Shallow trench isolations are provided in a semiconductor substrate. Ions are implanted into the semiconductor substrate to form a first well and a second well. The first well forms the drain of the planned thick gate oxide MOS transistor. The second well forms the source of the planned thick gate oxide MOS transistor. A thin oxide layer is formed overlying the semiconductor substrate. A polysilicon layer is deposited overlying the thin oxide layer. The polysilicon layer is patterned to form a dummy floating gate. Ions are implanted into the first well and the second well to form a first lightly-doped region and a second lightly-doped region of the same type as the first well and the second well. The first and second lightly-doped regions are self-aligned to the dummy floating gate. Sidewall spacers are formed on the floating dummy gates.

Ions are implanted into the first well and the second well to form a first heavily-doped region and a second heavily-doped region of the same type as the first and second wells. The heavily-doped regions are self-aligned to the sidewall spacers. An interlevel dielectric layer is deposited overlying the floating dummy gate and the semiconductor substrate. A metal layer is deposited overlying the interlevel dielectric layer. The metal layer is patterned to form the gate electrode to complete the thick oxide MOS transistor in the manufacture of the integrated circuit device.

Also in accordance with the objects of this invention, a thick oxide MOS transistor device for electrostatic discharge protection is achieved. A thin oxide layer overlies a semiconductor substrate. A gate electrode comprises first a polysilicon layer overlying the thin oxide layer. An interlevel dielectric layer overlies the polysilicon layer. A metal layer overlies the interlevel dielectric layer to complete the gate electrode. A drain junction comprises first a first well in the semiconductor substrate that partially underlies the gate electrode. The first well is counter-doped to the semiconductor substrate. A first heavily-doped region is of the same type as the first well and is inside the first well to provide a contact region for the drain junction. A first lightly-doped region is of the same type as the first well and is inside of the first well to complete the drain junction. A source junction comprises first a second well in the semiconductor substrate that partially underlies the gate electrode. The second well is counter-doped to the semiconductor substrate. A second heavily-doped region is of the same type as the second well and is inside the second well to provide a contact region for the source junction. A second lightly-doped region is of the same type as the second well and is inside of the second well to complete the source junction.

BRIEF DESCRIPTION OF THE DRAWINGS

In the accompanying drawings forming a material part of this description, there is shown.

DESCRIPTION OF THE PREFERRED EMBODIMENTS

The preferred embodiment discloses the application of the present invention to the formation of thick oxide MOS transistors for electrostatic discharge (ESD) protection in the manufacture of integrated circuit devices. It should be clear to those experienced in the art that the present invention can be applied and extended without deviating from the scope of the present invention.

An important feature of the present invention is the ability to create a robust thick oxide MOS transistor for ESD protection while making no changes to the sub-micron CMOS process flow. The thick oxide MOS transistor is therefore fabricated concurrently with the fabrication of the sub-micron CMOS device. This offers the distinct advantage of adding a high performance ESD protection device to the sub-micron CMOS process with no additional cost.

Figure 3:
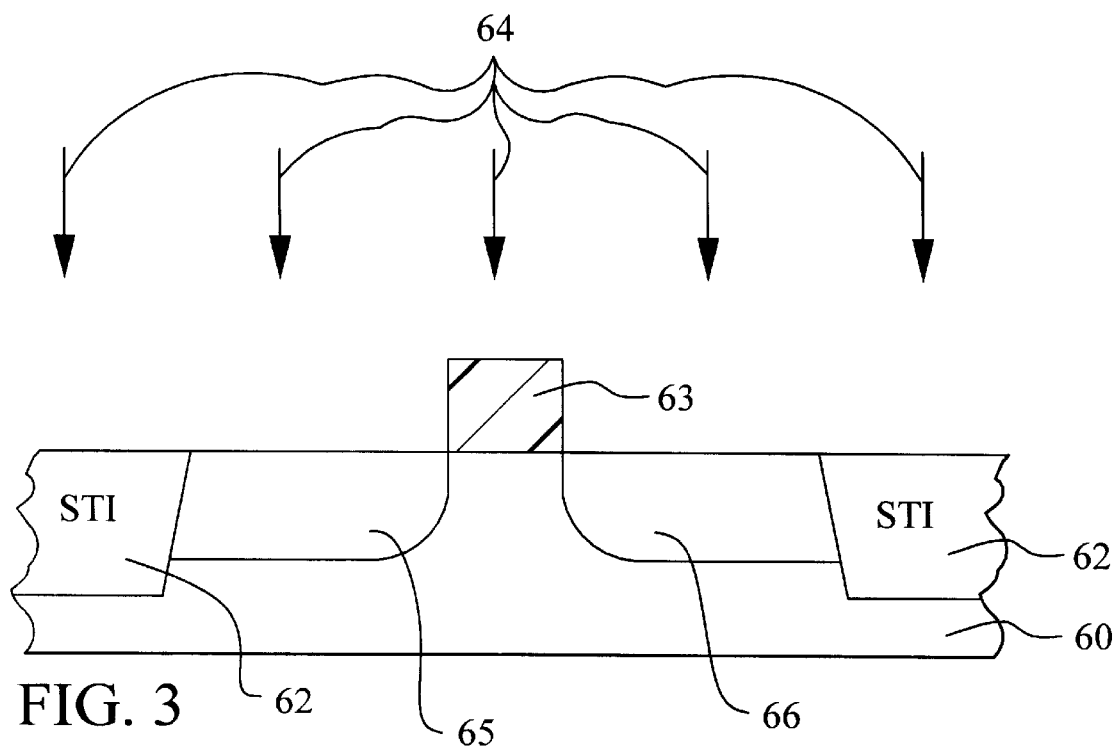
FIGS. 3 through 11 schematically illustrate in cross-sectional representation the preferred embodiment of the present invention.

Referring now particularly to FIG. 3, there is shown a cross-sectional representation of the preferred embodiment of the present invention. A semiconductor substrate 60 is provided. The semiconductor substrate 60 preferably comprises monocrystalline silicon that is lightly doped. As a preferred embodiment, the semiconductor substrate 60 may be p-type silicon with a resistivity of between about 6 ohm-cm and 9 ohm-cm. Shallow trench isolations (STI) 62 are formed in the semiconductor substrate 60 to define active and non-active areas. As noted in the prior art analysis, the use of STI for isolation is required by many sub-micron processes. The STI 62 are formed by a conventional process where trenches are etched according to the active area mask, a silicon dioxide layer is deposited, and a chemical mechanical polish (CMP) is performed.

A mask 63 is formed overlying the semiconductor substrate 60 to define areas where wells will be formed. The mask 63 preferably comprises a photoresist layer 63 that has been deposited and patterned using a photolithographic sequence well known in the art.

Ions are implanted 64 into the semiconductor substrate 60 to form a first well 65 and a second well 66. The first well 64 and the second well 66 are counter-doped to the semiconductor substrate 60. In the preferred process, the first well 65 and the second well 66 are doped n-type and are therefore N-Well tubs. The first well 65 forms the drain for the planned thick gate oxide MOS transistor. The second well 66 forms the source.

Note that the first well 65 and the second well 66 are formed using the same process step as is used to form the n-well regions for the standard CMOS process. Therefore, the method of the present requires no new process steps, time, or expense.

The dopant species used for the implantation 64 is preferably phosphorus. The ion implantation is preferably performed using a dose of between about $5 \times 10^{12}$ atoms/cm$^2$ and $5 \times 10^{13}$ atoms/cm$^2$ and an energy of between about 130 KeV and 500 KeV. The first well 65 and the second well 66 are formed to a depth of between about 0.6 microns and 1.2 microns and a concentration of between about $1 \times 10^{17}$ atoms/cm$^3$ and $1 \times 10^{18}$ atoms/cm$^3$.

Note that the first well 65 and the second well 66 extend deep into the semiconductor substrate 60. To achieve this profile, a drive-in step is needed. The additional drive-in step deepens the wells, rounds the corners, and laterally diffuses the junctions under the sidewall spacers 92. The depth and corner rounding of the first well 65 and the second well 66 are important in achieving good parasitic n-p-n performance during ESD events. The lateral diffusion of the wells 65 and 66 lowers the threshold voltage of the thick gate oxide MOS transistor to improve performance. The drive-in step preferably comprises a thermal cycle of between about 800 degrees C. and 900 degrees C. for between about 30 minutes and 60 minutes.

Figure 4:
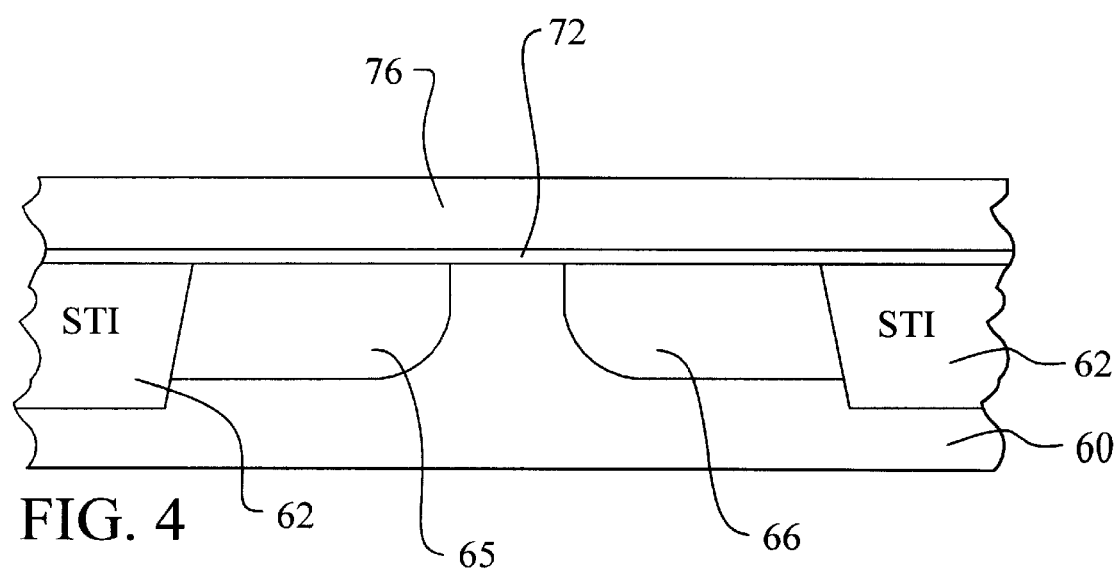

Referring now to FIG. 4, a thin oxide layer 72 is formed overlying the semiconductor substrate 60 and the STI 62. The thin oxide layer 72 is used in sub-micron CMOS transistors for the gate oxide layer. In the thick oxide MOS device of the present invention, the thin oxide layer 72 forms a part of the gate oxide for device. The thin oxide layer 72 comprises silicon dioxide that is formed by thermal oxidation of the semiconductor substrate 60. In the preferred embodiment, the thin oxide layer 72 is formed to a thickness of between about 40 Angstroms and 80 Angstroms.

A polysilicon layer 76 is deposited overlying the thin oxide layer 72. The polysilicon layer 76 will form a dummy floating gate for the thick gate oxide MOS device of the present invention. Concurrently, the sub-micron transistor gates, not shown, will be formed using this same polysilicon layer 76. The polysilicon layer 76 is preferably deposited using a low-pressure CVD process to a thickness of between about 2,000 Angstroms and 3,000 Angstroms.

Figure 5:
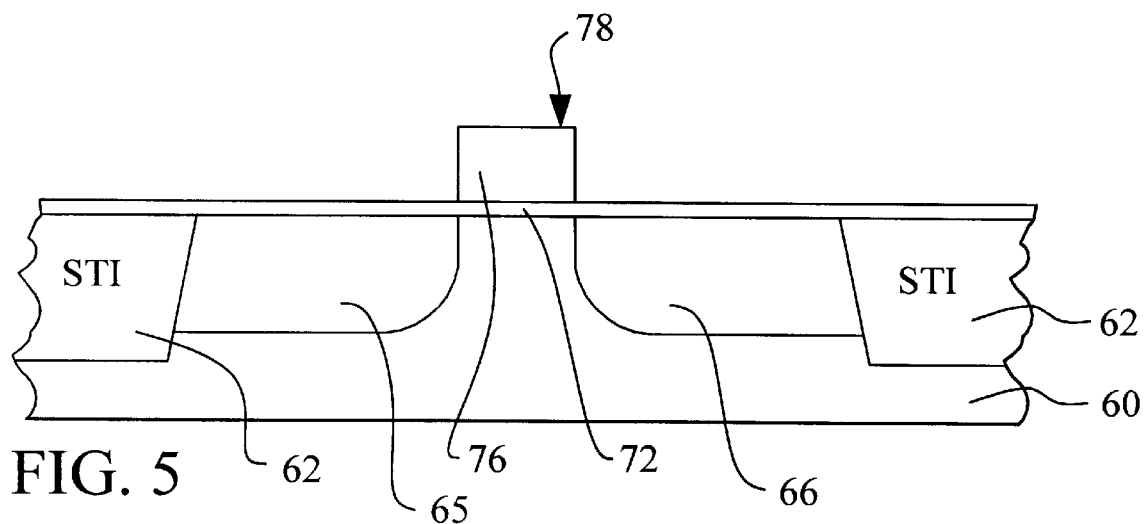

Referring now to FIG. 5, the polysilicon layer 76 is patterned to form dummy floating gates 78. The dummy floating gates 78 are patterned such that the polysilicon layer 76 will not be connected to other circuitry. The transistor gates, not shown, of the sub-micron CMOS devices are patterned concurrently with the patterning of the dummy floating gate 78. The patterning step is preferably performed using a conventional lithography and etch sequence.

Figure 6:
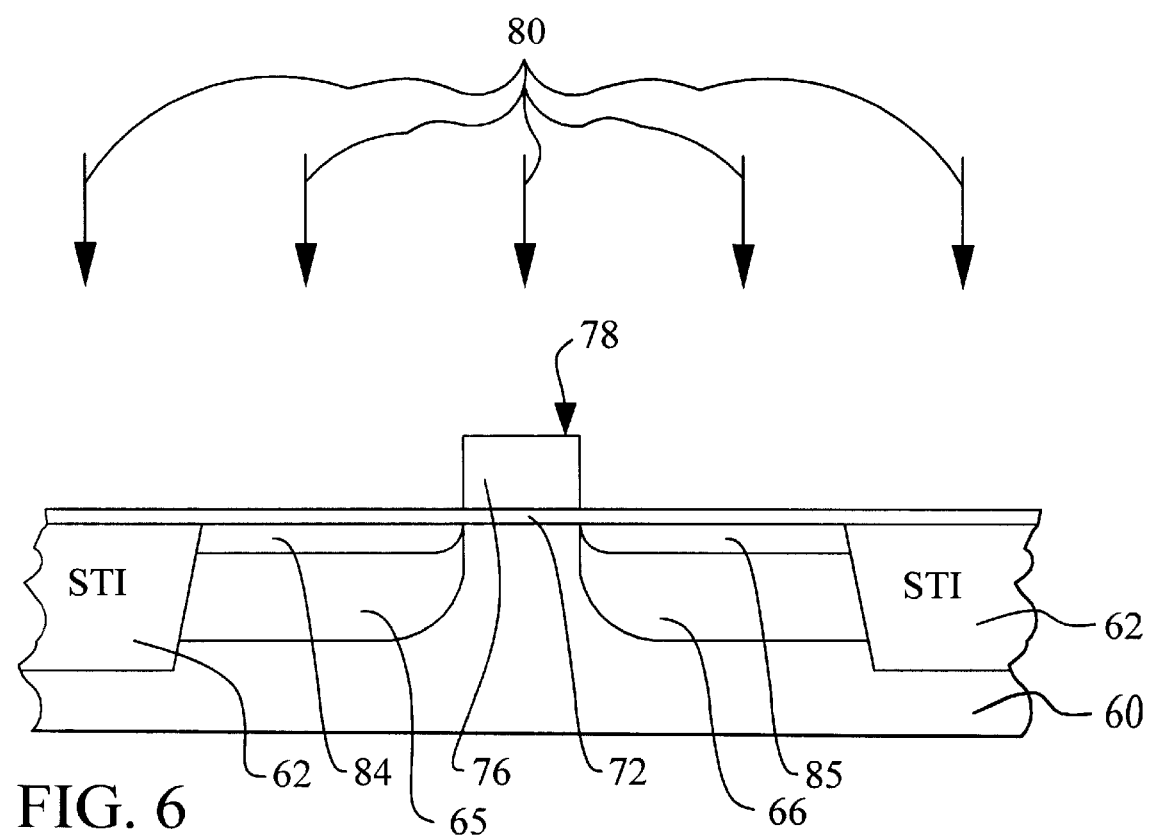

Referring now to FIG. 6, ions are implanted 80 into the first well 65 and the second well 66 to form lightly-doped regions 84 and 85 of the same type (donor or acceptor) as the first and second wells 65 and 66. Many sub-micron processes use a lightly-doped region, or drain, to improve short channel performance. If the sub-micron process requires the lightly-doped region, then this implant would be performed on the thick oxide MOS device as well. The implantation 80 is self-aligned to the dummy floating gate. The first lightly-doped drain 84 is contained in the first well 65 while the second lightly-doped drain 85 is contained in the second well 66. The preferred implant 80 comprises arsenic implanted at a dose of between about $5\times10^{13}$ atoms/cm$^2$ and $5\times10^{14}$ atoms/cm$^2$ and an energy of between about 20 KeV and 30 KeV. The lightly doped regions 84 and 85 so formed have a junction depth of between about 0.05 microns and 0.15 microns and a concentration of between about $5\times10^{17}$ atoms/cm$^3$ and $5\times10^{18}$ atoms/cm$^3$.

Figure 7:
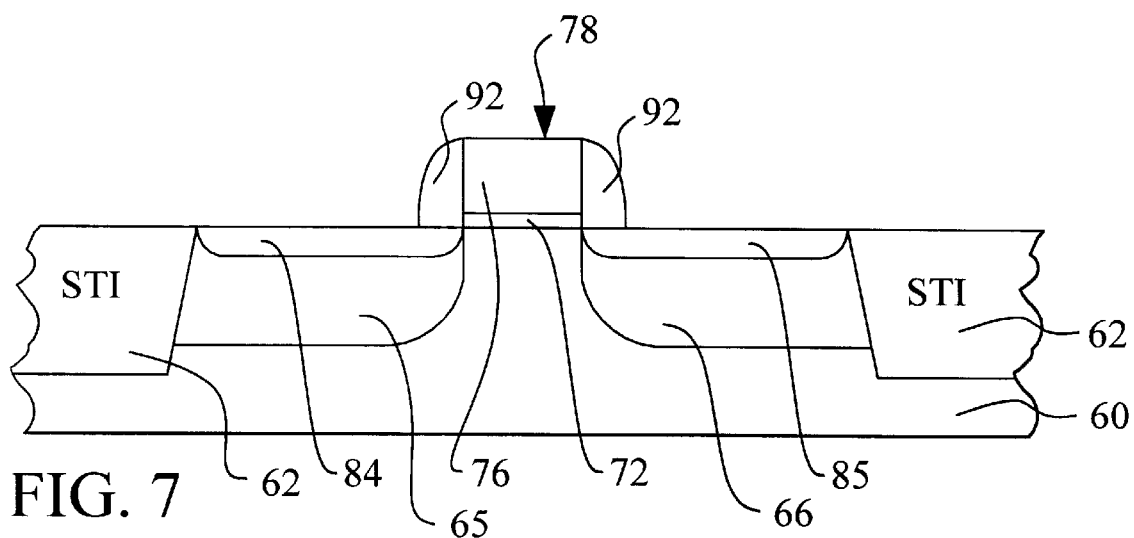

Referring now to FIG. 7, sidewall spacers 92 are formed on the dummy floating gates 78. The sidewall spacers 92 are used in the sub-micron CMOS process to space back the heavily-doped source and drains from the channel region of the MOSFET to reduce short channel effects. The sidewall spacers 92 are preferably formed using a plasma sputter etching process where material is concurrently deposited and plasma etched to effectively deposit primarily on sidewall surfaces. The sidewall spacers 92 may comprise either silicon dioxide or silicon nitride.

Figure 8:
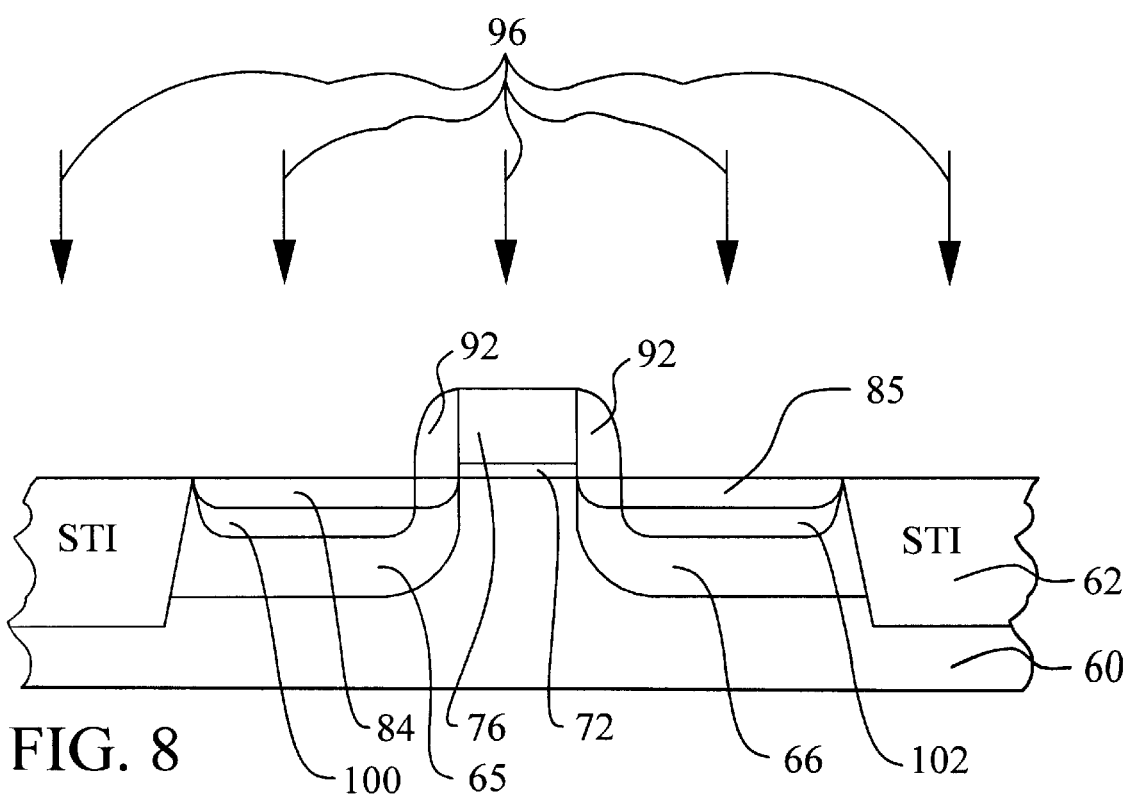

Referring now to FIG. 8, ions are implanted 96 into the first well 65 and the second well 66 to form heavily-doped regions 100 and 102 of the same type (donor or acceptor) as the first and second wells 65 and 66. The first heavily-doped region 102 forms the contact area for the drain, and the second heavily-doped region 100 forms the contact area for the source. To establish good ohmic contact between metal traces and substrate junctions, the substrate junctions must be heavily doped at the contact area to reduce resistivity and to reduce metal spiking. The presence of the first heavily-doped region 102 and the second heavily-doped region 100 provides for such ohmic contact for the drain the source, respectively. The first heavily-doped region 100 is contained in the first well 65. The second heavily-doped region 102 is contained in the second well 66.

The ion implantation species is preferably arsenic for compatibility with the preferred sub-micron CMOS process. The ion implantation 96 is preferably performed using a dose of between about $1\times10^{15}$ atoms/cm$^2$ and $1\times10^{16}$ atoms/cm$^2$ and an energy of between about 50 KeV and 80 KeV. The heavily-doped regions 100 and 102 have a depth of between about 0.15 microns and 0.20 microns and a concentration of between about $1\times10^{20}$ atoms/cm$^2$ and $1\times10^{21}$ atoms/cm$^2$.

The source and drain implants for the sub-micron NMOS transistors, not shown, are performed concurrently with this implantation. Note that the heavily-doped regions 100 and 102 are self-aligned to the sidewall spacers 92.

Figure 9:
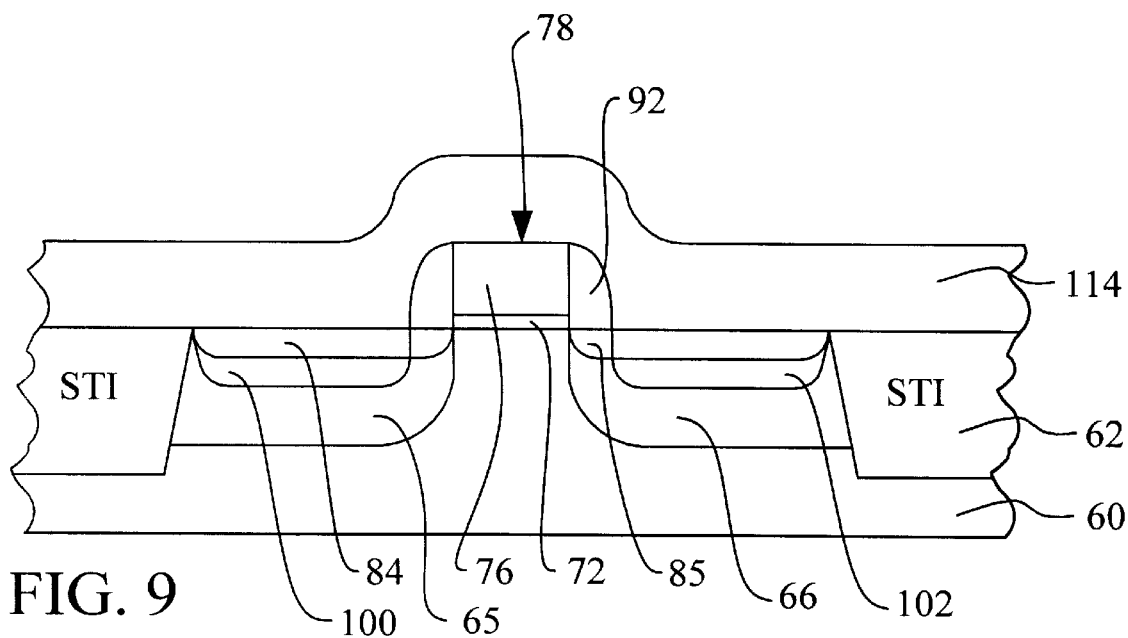

Referring now to FIG. 9, an interlevel dielectric layer 114 is deposited overlying the dummy floating gate 78 and the semiconductor substrate 60. The interlevel dielectric layer 114 isolates the device level from the subsequently formed metal level of the integrated circuit. In the present invention, the interlevel dielectric layer 114 will form a part of the gate oxide for the thick oxide MOS transistor. The relatively large thickness of the interlevel dielectric layer 114 provides both ESD robustness and a large voltage threshold for the device.

The interlevel dielectric layer 114 may comprise a silicon dioxide material or a doped silicate material. In the preferred embodiment, the interlevel dielectric layer 114 may comprise, for example, high density plasma (HDP) deposited oxide, tetraethyl orthosilicate glass (TEOS), borophosphosilicate glass (BPSG), spin-on glass (SOG), or other typical intermetal dielectric (IMD) layer materials. The interlevel dielectric layer 114 is preferably deposited to a thickness of between about 4,000 Angstroms and 8,000 Angstroms.

Figure 10:
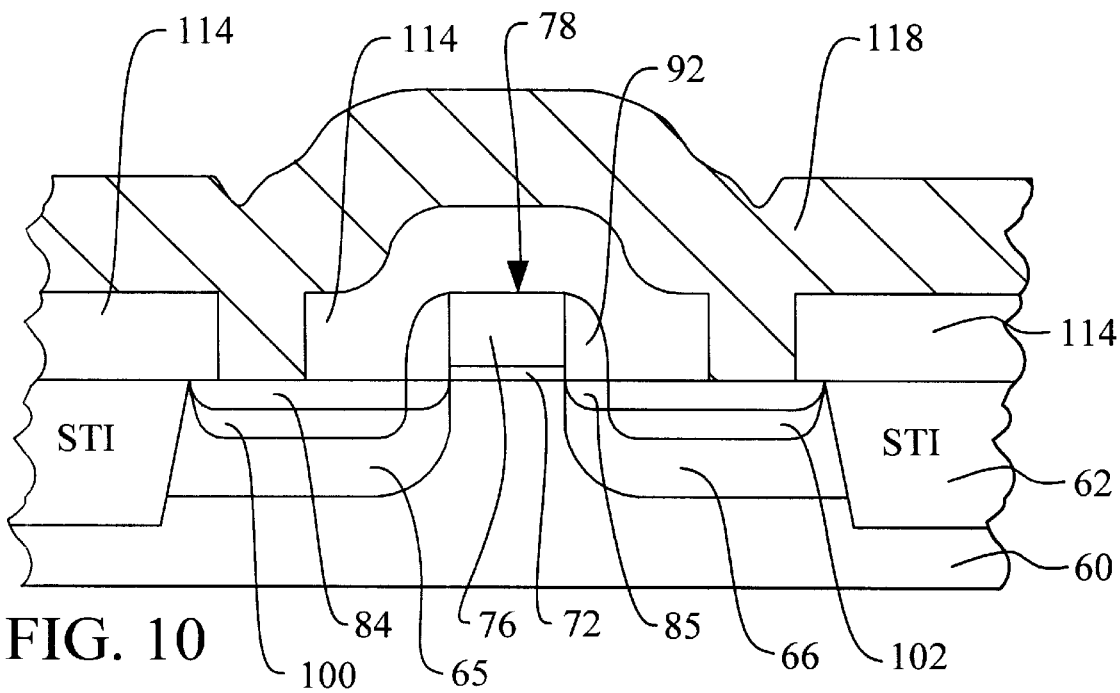

Referring now to FIG. 10, the interlevel dielectric layer 104 is patterned to form openings for contacts to the source and drain of the device. A metal layer 118 is deposited overlying the interlevel dielectric layer 114 and filling any contact openings. The metal layer 118 forms a connective level for the circuit. More importantly, the metal layer 118 forms the gate electrode for the thick oxide MOS transistor. The metal layer 118 comprises aluminum, aluminum alloys, copper, or copper alloys deposited preferably by physical vapor deposition. The interlevel dielectric layer 114 provides a thick oxide for the metal gate 118 that creates a large voltage threshold for the device.

Figure 1:
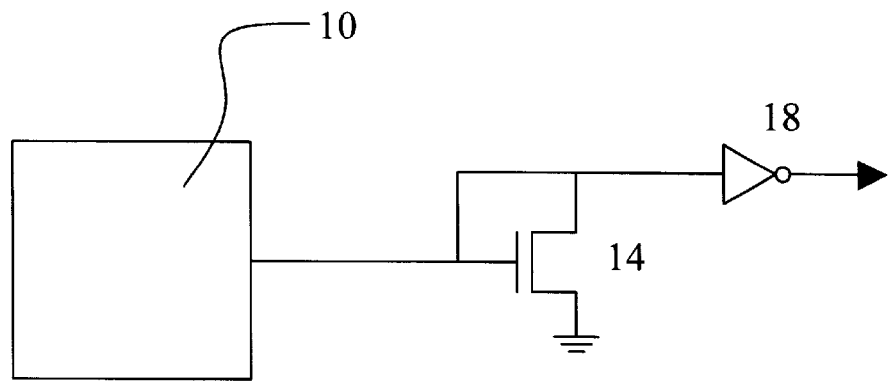
FIG. 1 schematically illustrates the prior art use of a field oxide device for ESD protection.
Figure 2:
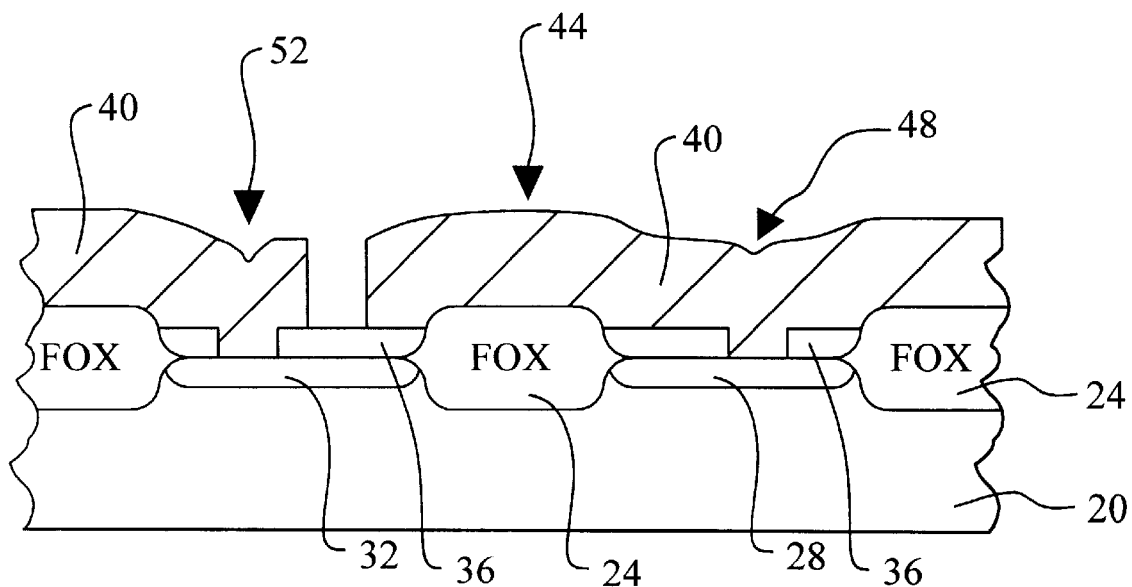
FIG. 2 schematically illustrates a cross-sectional view of a prior art, field oxide device.
Figure 11:
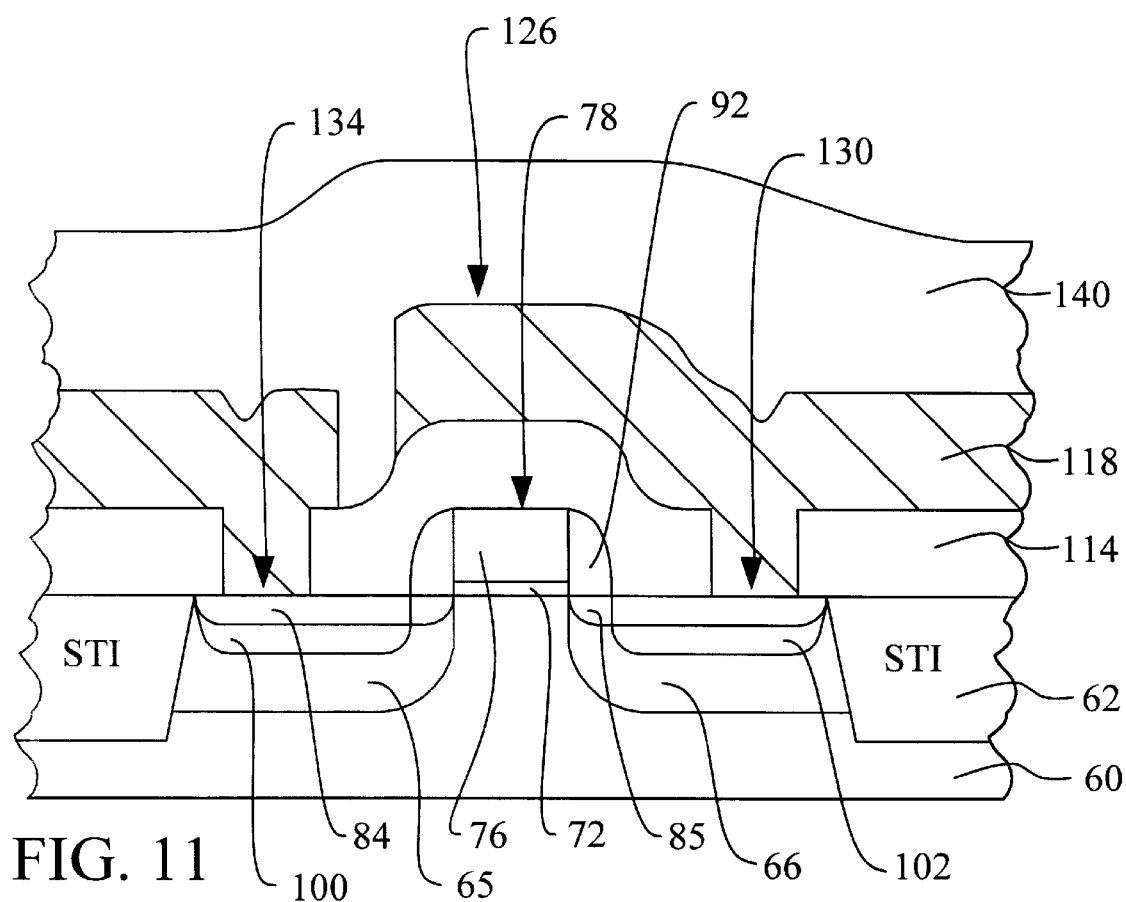

Referring now to FIG. 11, the metal layer 118 is patterned to define interconnections and to define the gate electrode 126. In the illustration, the thick oxide MOS transistor gate 126 and drain 130 are connected together while the source 134 is separated. This corresponds to the connectivity of the prior art FOD device of FIGS. 1 and 2. The metal layer 118 patterning may be performed using a conventional lithography and etch sequence. A plasma nitride layer 140 is deposited overlying the metal layer 118 and the interlevel dielectric layer 114 to complete the thick oxide MOS transistor in the manufacture of the integrated circuit device.

Referring again to FIG. 11, the thick oxide MOS transistor device of the present invention may now be described. A thin oxide layer 72 overlies a semiconductor substrate 60. A gate electrode 126 comprises first a polysilicon layer 76 overlying the thin oxide layer 72. An interlevel dielectric layer 114 overlies the polysilicon layer 76. A metal layer 118 overlies the interlevel dielectric layer 114 to complete the gate electrode 126. A drain junction 130 comprises first a first well 65 in the semiconductor substrate 60 that partially underlies the gate electrode 126. The first well 65 is counter-doped to the semiconductor substrate 60. A first heavily-doped region 102 is contained in the first well 65 to provide a contact region for the drain junction 130. A first lightly-doped region 84 is contained in the first well 65 to complete the drain junction 130. A source junction 134 comprises first a second well 66 in the semiconductor substrate 60 that partially underlies the gate electrode 126. The second well 66 is counter-doped to the semiconductor substrate 60. A second heavily-doped region 100 is contained in the second well 66 to provide a contact region for the source junction 134. A second lightly-doped region 85 is contained the second well 66 to complete the source junction 134.

The operation of the thick oxide MOS transistor may now be described. As in the prior art example of FIGS. 1 and 2, the device of the present invention is used to provide ESD protection for input pads of the integrated circuit. The gate 126 and drain 130 are tied to the pad while the source 134 is tied to a ground reference (VSS). The device is therefore connected as an MOS diode.

The thick oxide MOS transistor of the present invention comprises a drain diffusion region formed in the semiconductor substrate of the integrated circuit device, a source diffusion region formed in the semiconductor substrate, and a floating polysilicon layer sandwiched between the substrate and the metal gate. In the present invention, the floating polysilicon layer acts as a dummy layer to prevent trench formation between the drain and the source of the thick oxide NMOS transistor. If the dummy layer were not used a field oxide or STI region would be formed between the source and the drain region of the thick oxide MOS device. The real gate of the NMOS transistor is formed by the metal layer. This same metal layer overlaps the polysilicon dummy gate and is connected to the integrated circuit pad.

Note that the ESD performance of the device is improved by using the n-wells under the source and drain regions. By making the source and drain junctions deeper and by overlapping the lightly-doped drain regions, a drain profile is created that improves ESD performance.

When an ESD pulse is conducted at the pad, the presence of the large gate voltage on the thick oxide MOS transistor causes a change in the drain depletion profile. This, in turn, reduces the source (emitter for npn) barrier. Since the ESD pulse also appears at the drain metal, a drain induced barrier lowering (DIBL) effect is also seen. As the drain voltage increases, due to the DIBL effect, the potential barrier at the n-well source is lowered. In addition, generation of electron-hole pairs in the drain well depletion region takes place. In fact, it is found that this generation current dominates and increases as the drain voltage increases.

The presence of the large gate voltage strengthens the electric field present in the drain well depletion region. This higher electric field will result in a higher electron-hole generation current, and the hole current will be injected into the p-substrate. A potential difference is thereby created to forward bias the p-substrate to n-well junction. The DIBL effect lowers the potential barrier of the n-well junction.

After the n-well source to substrate forward biases, the device begins to operate in a bipolar mode with a very effective discharge path to bypass the ESD stress. Furthermore, because of the deep drain junction profile, the parasitic npn bipolar device is turned on at a lower voltage level than in the prior art FOD. After the bipolar device turns on, the drain voltage of the thick oxide MOS device decreases. A negative resistance operating region is observed due to the availability of additional carriers for multiplication. This negative resistance region is observed until a minimum voltage is reached. A snapback effect will also occur. Finally, the DIBL effect improves the performance of the parasitic npn by increasing the effective emitter area. This is a particularly effective feature of the present invention because of the source barrier lowering that occurs deep in the n-well junction and allows the power dissipation for the ESD event to take place deep in the device. Temperature rise of the device is thereby reduced.

The novel thick oxide MOS transistor of the present invention effectively protects against high-level ESD events. The novel method of forming this device allows its fabrication in a standard, sub-micron process using STI. Therefore, the significant advantages of the novel device can be attained without additional process complexity or cost.

As shown in the preferred embodiments, the present invention provides a very manufacturable process for forming thick gate oxide MOS transistors for electrostatic discharge protection in an integrated circuit device. A device and a method are achieved. The novel device performs a similar function to that of a field oxide device. However, it may be formed without benefit of a field oxide layer. Deep wells are used to improve the performance of the parasitic n-p-n during snapback. The thick interlevel dielectric layer provides a large voltage threshold. Finally, the device and method are achieved with no impact to the sub-micron CMOS process.

While the invention has been particularly shown and described with reference to the preferred embodiments thereof, it will be understood by those skilled in the art that various changes in form and details may be made without departing from the spirit and scope of the invention.

What is claimed is:

1. A method to fabricate a thick oxide MOS transistor for electrostatic discharge protection in the manufacture of an integrated circuit device comprising:

providing a semiconductor substrate;

implanting ions into said semiconductor substrate to form a first well and a second well where said first well and said second well are counter-doped to said semiconductor substrate, where said first well forms the drain, and where said second well forms the source;

forming a thin oxide layer overlying said semiconductor substrate;

depositing a polysilicon layer overlying said thin oxide layer;

patterning said polysilicon layer to form a dummy floating gate;

forming sidewall spacers on said dummy floating gate;

implanting ions into said first well and said second well to form a first heavily-doped region and a second heavily-doped region of the same type as said first well and said second well where said implanting is self-aligned to said sidewall spacers;

depositing an interlevel dielectric layer overlying said dummy floating gate and said semiconductor substrate;

depositing a metal layer overlying said interlevel dielectric layer; and patterning said metal layer to form the gate electrode to complete the thick gate oxide MOS transistor in the manufacture of the integrated circuit device.

2. The method according to claim 1 wherein said thin oxide layer is formed to a thickness of between about 40 Angstroms and 80 Angstroms.

3. The method according to claim 1 wherein said interlevel dielectric layer is deposited to a thickness of between about 4,000 Angstroms and 8,000 Angstroms.

4. The method according to claim 1 wherein said first well and said second well are implanted to a depth of between about 0.6 microns and 1.2 microns and a concentration of between about $1\times10^{17}$ atoms/cm$^3$ and $1\times10^{18}$ atoms/cm$^3$.

5. The method according to claim 1 wherein said first heavily-doped region and said second heavily-doped region are implanted to a depth of between about 0.15 microns and 0.20 microns and a concentration of between about $1\times10^{20}$ atoms/cm$^3$ and $1\times10^{21}$ atoms/cm$^3$.

6. The method according to claim 1 further comprising implanting ions into said first well and said second well to form a first lightly-doped region and a second lightly-doped region after said step of patterning said polysilicon layer and before said step of forming said sidewall spacers where said implanting is self-aligned to said dummy floating gate.

7. The method according to claim 6 wherein said first lightly-doped region and said second lightly-doped region are implanted to a depth of between about 0.05 microns and 0.15 microns and a concentration of between about $5\times10^{17}$ atoms/cm$^3$ and $5\times10^{18}$ atoms/cm$^3$.

8. A method to fabricate a thick oxide MOS transistor for electrostatic discharge protection in the manufacture of an integrated circuit device comprising:

providing a semiconductor substrate;

implanting ions into said semiconductor substrate to form a first well and a second well where said first well and said second well are counter-doped to said semiconductor substrate, where said first well forms the drain, and where said second well forms the source;

forming a thin oxide layer overlying said semiconductor substrate;

depositing a polysilicon layer overlying said thin oxide layer;

patterning said polysilicon layer to form a dummy floating gate;

implanting ions into said first well and said second well to form lightly-doped regions of the same type as said first well and said second well where said implanting is self-aligned to said dummy floating gate;

forming sidewall spacers on said dummy floating gate;

implanting ions into said first well and said second well to form heavily-doped regions of the same type as said first well and said second well where said implanting is self-aligned to said sidewall spacers;

depositing an interlevel dielectric layer overlying said dummy floating gate and said semiconductor substrate;

depositing a metal layer overlying said interlevel dielectric layer; and patterning said metal layer to form the gate electrode to complete the thick gate oxide MOS transistor in the manufacture of the integrated circuit device.

9. The method according to claim 8 wherein said thin oxide layer is formed to a thickness of between about 40 Angstroms and 80 Angstroms.

10. The method according to claim 8 wherein said interlevel dielectric layer is deposited to a thickness of between about 4,000 Angstroms and 8,000 Angstroms.

11. The method according to claim 8 wherein said first well and said second well are implanted to a depth of between about 0.6 microns and 1.2 microns and a concentration of between about $1\times10^{17}$ atoms/cm$^3$ and $1\times10^{18}$ atoms/cm$^3$.

12. The method according to claim 8 wherein said first lightly-doped region and said second lightly-doped region are implanted to a depth of between about 0.05 microns and 0.15 microns and a concentration of between about $5\times10^{17}$ atoms/cm$^3$ and $5\times10^{18}$ atoms/cm$^3$.

13. The method according to claim 8 wherein said first heavily-doped region and said second heavily-doped region are implanted to a depth of between about 0.15 microns and 0.20 microns and a concentration of between about $1\times10^{20}$ atoms/cm$^3$ and $1\times10^{21}$ atoms/cm$^3$.

14. A thick oxide MOS transistor device for electrostatic discharge protection comprising:

a semiconductor substrate;

a thin oxide layer overlying said semiconductor substrate;

a gate electrode comprising:
   a polysilicon layer overlying said thin oxide layer;
   an interlevel dielectric layer overlying said polysilicon layer; and
   a metal layer overlying said interlevel dielectric layer;

a drain junction comprising:
   a first well in said semiconductor substrate and partially underlying said gate electrode where said first well is counter-doped to said semiconductor substrate; and
   a first heavily-doped region of the same type as said first well and inside said first well to provide a contact region for said drain junction;

a source junction comprising:
   a second well in said semiconductor substrate and partially underlying said gate electrode and where said second well is counter-doped to said semiconductor substrate; and
   a second heavily-doped region of the same type as said second well and inside said second well to provide a contact region for said source.

15. The device according to claim 14 wherein said first well has a depth of between about 0.6 microns and 1.2 microns and a concentration of between about $1\times10^{17}$ atoms/cm$^3$ and $1\times10^{18}$ atoms/cm$^3$.

16. The device according to claim 14 wherein said second well has a depth of between about 0.6 microns and 1.2 microns and a concentration of between about $1\times10^{17}$ atoms/cm$^3$ and $1\times10^{18}$ atoms/cm$^3$.

17. The device according to claim 14 wherein said first heavily-doped region has a depth of between about 0.15 microns and 0.20 microns and a concentration of between about $1\times10^{20}$ atoms/cm$^3$ and $1\times10^{21}$ atoms/cm$^3$.

18. The device according to claim 14 wherein said second heavily-doped region has a depth of between about 0.15 microns and 0.20 microns and a concentration of between about $1\times10^{20}$ atoms/cm$^3$ and $1\times10^{21}$ atoms/cm$^3$.

19. The device according to claim 14 further comprising:

sidewall spacers on said polysilicon layer;

a first lightly-doped region of the same type as said first well and inside said first well; and a second lightly-doped region of the same type as said second well and inside said second well.

20. The device according to claim 19 wherein said first lightly-doped region and said second lightly-doped region each have a depth of between about 0.05 microns and 0.15 microns and a concentration of between about $5\times10^{17}$ atoms/cm$^3$ and $5\times10^{18}$ atoms/cm$^3$.

* * * * *